United States Patent
Sugihara

(10) Patent No.: US 6,492,599 B1
(45) Date of Patent: Dec. 10, 2002

(54) MULTILAYER WIRING BOARD, MANUFACTURING METHOD THEREOF, AND WAFER BLOCK CONTACT BOARD

(75) Inventor: Osamu Sugihara, Kofu (JP)

(73) Assignee: Hoya Corporation (JP)

( * ) Notice: Subject to any disclaimer, the term of this patent is extended or adjusted under 35 U.S.C. 154(b) by 0 days.

(21) Appl. No.: 09/659,969

(22) Filed: Sep. 12, 2000

(30) Foreign Application Priority Data

Sep. 13, 1999 (JP) ............................................ 11-258545
Aug. 28, 2000 (JP) ........................................ 2000-258261

(51) Int. Cl.⁷ .............................. H05K 1/00; H05K 1/03
(52) U.S. Cl. ...................... 174/258; 174/255; 174/262; 174/264; 361/746; 361/795; 361/812; 428/901
(58) Field of Search ................................. 174/258, 255, 174/256, 259, 262, 261, 263, 264; 361/792, 793, 795, 812, 748, 751, 783, 746; 257/698, 692, 737, 778; 428/209, 210, 901

(56) References Cited

U.S. PATENT DOCUMENTS

| | | | | |
|---|---|---|---|---|
| 4,371,744 A | * | 2/1983 | Badet et al. | 174/254 |
| 5,541,524 A | * | 7/1996 | Tuckerman et al. | 324/754 |
| 5,686,525 A | | 11/1997 | Maruta et al. | |
| 5,936,843 A | * | 8/1999 | Ohshima et al. | 361/760 |
| 5,972,807 A | * | 10/1999 | Tani et al. | 442/63 |
| 6,022,466 A | * | 2/2000 | Tamarkin et al. | 205/126 |
| 6,064,213 A | * | 5/2000 | Khandros et al. | 324/754 |
| 6,117,765 A | * | 9/2000 | Kim et al. | 438/624 |
| 6,162,365 A | * | 12/2000 | Bhatt et al. | 216/13 |
| 6,212,078 B1 | * | 4/2001 | Hunt et al. | 361/793 |
| 6,215,321 B1 | * | 4/2001 | Nakata | 324/754 |
| 6,217,987 B1 | * | 4/2001 | Ono et al. | 428/209 |
| 6,251,502 B1 | * | 6/2001 | Yasue et al. | 428/209 |

FOREIGN PATENT DOCUMENTS

| | | | |
|---|---|---|---|
| DE | 42 37 591 | | 5/1994 |
| EP | 0 838 853 | | 4/1998 |
| GB | 2 240 663 | | 8/1991 |
| JP | 7-231019 | | 8/1995 |
| JP | 409326556 A | * | 12/1997 |
| JP | 410041632 A | * | 2/1998 |
| JP | 410326966 A | * | 12/1998 |
| JP | 411026942 A | * | 1/1999 |
| JP | 411121553 A | * | 4/1999 |
| JP | 02000349447 A | * | 12/2000 |

OTHER PUBLICATIONS

1) JP 09–153585 English abstract.
2) European Search Report of EP 00 11 9889 dated Jul. 16, 2001.

* cited by examiner

Primary Examiner—David L. Talbott
Assistant Examiner—I. B. Patel
(74) Attorney, Agent, or Firm—Cook, Alex, McFarron, Manzo, Cummings & Mehler, Ltd.

(57) ABSTRACT

In a multilayer wiring board comprising: an insulating board (for example, a glass board 1); and a wiring layer (for example, wiring patterns 2a, 5a and 8a) superimposed on the insulating board through an insulating film (for example, insulating films 3 and 6), a sum (total film thickness) d ($\mu$m) of the thickness of the insulating films 3 and 6 and the internal stress f (MPa) of the insulating film satisfy the following relational expression (1):

$$d \times f < 700 (\text{MPa} \cdot \mu m) \tag{1}$$

15 Claims, 7 Drawing Sheets

NOT LESS THAN 1.5 W

MULTILAYER WIRING BOARD, MANUFACTURING METHOD THEREOF, AND WAFER BLOCK CONTACT BOARD

REFERENCE TO RELATED APPLICATION

This application claims the priority right under Paris Convention of Japanese Patent Application Nos. 258545/1999 filed on Sep. 13, 1999 and 258261/2000 filed on Aug. 28, 2000, the entire disclosure of which is incorporated herein by reference.

BACKGROUND OF THE INVENTION (i) Field of the Invention

The present invention relates to a multilayer wring board suitable as a multilayer wiring board for a wafer block contact board constituting a part of a wafer block contact board used for executing a test (inspection) of a plurality of semiconductor devices formed on a wafer in the state of a wafer in a lump, and a manufacturing method thereof and others.

(ii) Description of the Related Art

The inspection for a plurality of semiconductor devices formed on a wafer is roughly divided into a product inspection by using a probe guard (electrical characteristic test) and a burn-in test which is a reliability test carried out after the former test.

The burn-in test is one of screening tests conducted in order to eliminate a semiconductor device which has an inherent defect or a device which develops trouble depending on a time and stress due to irregularities in manufacture. It can be said that the inspection using a probe card is an electrical characteristic test of a manufactured device, whereas the burn-in test is a thermal acceleration test.

If the burn-in test adopts an usual method by which a wafer is cut into chips by dicing after the electrical characteristic test conducted for each chip by using the probe card and the burn-in test is executed with respect to each packaged chip (1-chip burn-in system), the feasibility is poor in terms of cost. Therefore, development and practical application of a wafer block contact board (burn-in board) for conducting the burn-in test of multiple semiconductor devices formed on the wafer in a lump are advanced (Japanese patent application laid-open No. 231019-1995). A wafer block burn-in system using a wafer block contact board has the high feasibility in terms of cost and is an important technique in order to realize the trend of up-to-date technology such as the pair chip shipment or pair chip onboard.

The wafer block contact board has a different demand characteristic from that of the conventional probe card in that the wafer is inspected in a lump and the board is used for a heating test, and has the high demand level. If the wafer block contact board comes into practical use, the product inspection (electrical characteristic test) which has been carried out by using the probe card in the prior art can be conducted with respect to the wafer in a lump.

FIG. 12 shows one specific example of the wafer block contact board.

As shown in FIG. 12, the wafer block contact board has such a structure as that a membrane ring 30 having bumps is fixed on a multilayer wiring board for a wafer block contact board (which will be referred to as a multilayer wiring board hereinafter) 10 through an anisotropic conductive rubber sheet 20.

The membrane ring 30 having bumps bears a contact portion which directly comes into contact with a device to be inspected. In the membrane ring 30 having bumps, a bump 33 is formed on one side of a membrane 32 stretched across a ring 31 and a pad 34 is formed on the other side of the same. The bump 33 is associated with a rim of each semiconductor device (chip) on a wafer 40 or a pad formed on a center line (one chip corresponds to approximately 600 to 1000 pins and pads whose number is a product obtained by multiplying the number of pins by the number of chips are formed on the wafer) and the bumps 33 are formed at positions whose number is equal to the number of pads.

The membrane ring with bumps 30 bears a contact portion which directly comes into contact with a device to be inspected. In the membrane ring with bumps 30, a bump 33 is formed on one side of a membrane 32 stretched across a ring 31 and a pad 34 is formed on the other side of the same. The bump 33 is associated with a rim of each semiconductor device (chip) on a wafer 40 or a pad formed on a center line (one chip corresponds to approximately 600 to 1000 pins and pads whose number is a product obtained by multiplying the number of pins by the number of chips are formed on the wafer) and the bumps 33 are formed at positions whose number is equal to the number of pads.

The multilayer wiring board 10 has on an insulating board a wring for supplying a predetermined burn-in test signal and others to each bump 33 isolated on the membrane 32 through the pad 34. Since the wiring of the multilayer wiring board 10 is complicated, the multilayer wiring board 10 usually has a multilayer wiring structure such that a plurality of wiring layers are superimposed through an insulating film. Further, in the multilayer wiring board 10, the insulating board having the low coefficient of thermal expansion is used in order to avoid a connection failure caused by displacement of the pad 34 on the membrane 32 due to thermal expansion.

The anisotropic conductive rubber sheet 20 is an elastic body (which consists of silicon resin and has metal particles embedded in a pad electrode portion thereof) having the conductivity only in a direction vertical to a principal surface and electrically connects a terminal (not shown) of the multilayer wiring board 10 with a pad 34 on the membrane 32. When a convex portion of the anisotropic conductive rubber sheet 20 formed on the surface thereof is brought into contact with the pad 34 on the membrane 32, irregularities of the surface of the semiconductor wafer 40 and unevenness of the heights of the bumps can be absorbed, and the pad on the semiconductor wafer can be assuredly connected to the bump 33 on the membrane 32.

To each semiconductor device (chip) are formed a power supply of an integrated circuit, a ground and a pad electrode which functions as an input/output terminal (I/O terminal) for a signal (a power supply pad, a ground pad and an I/O pad) respectively, and a bump electrode of the wafer block contact board is formed and connected in one-to-one relationship with respect to all the pad electrodes of the semiconductor chip.

In the multilayer wiring board constituting a part of the above-described wafer block contact board, when the insulating film and the wiring layer are superimposed and formed on the insulating board having the coefficient of thermal expansion of not more than 10 ppm/° C. (for example, a low expansion glass board), a crack may be generated in the insulating film. This tendency becomes prominent in the insulating film of the upper layer. For example, when the wiring layer, the insulating film, the wiring layer, the insulating film and the wiring layer are alternately superimposed on the insulating board in the mentioned order, a crack is apt to be generated in the insulating film of the upper layer (the insulating film of the second layer) in particular. On the other hand, when the insulating film and the wiring layer are alternately formed on the insulating board having the coefficient of thermal expansion of not less than 10 ppm/° C. (for example, a board made of resin), a crack is not produced in the insulating film but displacement of the bump occurs when the coefficient of thermal coefficient of the wafer becomes large, which may result in the contact failure.

The cause for a crack generated in the insulating film can be considered as follows. That is, although the insulating film is generally formed by applying a liquid polymer antecedent which is then cured and highly polymerized, reduction in its cubic volume due to evaporation of a solvent or polymerization reaction generates the internal stress in the insulating film. The force produced across the insulating film (which will be referred to as a membrane stress) becomes large as a thickness of the insulating film is increased. Similarly, since the wiring of the wiring layer is partial in terms of the planar dimension, the insulating films adjacent to each other become integral at a position where no wiring is provided when the insulating film is superimposed. Thus, the thickness of the insulating film increases and the membrane stress also becomes high. Further, in general, since the coefficient of thermal expansion of the insulating film is larger than the coefficient of thermal expansion of the low expansion glass board or the wiring (10 ppm/° C.), the thermal stress due to a difference in coefficient of thermal expansion is generated in the insulating film under the influence of heat during use of the multilayer wiring board or in the inspection process such as the burn-in test. It can be considered that these stresses are concentrated on a corner portion of a wiring pattern $5a$ in the multilayer wiring board formed by sequentially superimposing a wiring pattern $2a$ of the first layer, the insulating film 3 and the wiring pattern $5a$ of the second layer on the glass board 1 shown in FIGS. 5 and 6 or a corner portion of a rectangular contact hole (a square via) 12 for energizing the upper and lower wiring layers shown in FIG. 7($a$) so that a crack 11 is generated in the insulating film 3 which is in contact with these corner portions.

SUMMARY OF THE INVENTION

In view of the above-described drawbacks, a first object of the present invention is to provide a multilayer wiring board capable of preventing a crack from being generated in an insulating film and avoiding the performance degradation of the multilayer wiring board or reduction in the reliability even though the insulating film and the wiring layer are alternately formed on the insulating board having the coefficient of thermal expansion of not more than 10 ppm/° C. in particular.

Further, a second object of the present invention is to provide a multilayer wiring board for a wafer block contact board capable of preventing a crack from being generated in an insulating film and avoiding the performance degradation of the multilayer wiring board or reduction in the reliability and provide a wafer block contact board having the multilayer wiring board for a wafer block contact board.

Furthermore, a third object of the present invention is to provide a method for manufacturing a multilayer wiring board capable of manufacturing the multilayer wiring board in a simple process without adding a complicated process.

To this end, the present invention has the following structure.

(Structure 1) In a multilayer wiring board comprising: an insulating board; and a wring layer superimposed on the insulating board through an insulating film, a sum (total film thickness) d ($\mu$m) of the thickness of the insulating film and internal stress f (MPa) of the insulating film satisfy the following relational expression (1):

$$d \times f < 700 (\text{MPa} \cdot \mu\text{m}) \tag{1}$$

(Structure 2) The multilayer wiring board according to the structure 1 is characterized in that the sum (total film thickness) d of the thickness of the insulating film is not less than 0.1 $\mu$m and less than 50 $\mu$m and the internal stress f of the insulating film f is not less than 14 MPa and less than 7000 MPa.

(Structure 3) The multilayer wiring board according to the structure 1 or 2 is characterized in that the coefficient of thermal expansion of the insulating board is not more than 10 ppm/° C.

(Structure 4) In a multilayer wiring board comprising: an insulating board; and a wiring board superimposed on the insulating board through an insulating film, a corner portion of the wiring in the wiring board has such a shape as that a crack is hardly generated in the insulating film.

(Structure 5) In a multilayer wiring board comprising: an insulating board; and a plurality of wiring layers superimposed in the insulating board through an insulating film, an edge and/or a corner portion of the wiring in the wiring layer is so formed as to be shifted from an edge and/or a corner portion of the wiring of another wiring layer superimposed through the insulating film by not less than 100 $\mu$m in a flat surface direction.

(Structure 6) In a multilayer wiring board comprising: an insulating board; and a wiring layer superimposed on the insulating board through an insulating film, a protective film is formed only at a contact terminal portion in an uppermost wiring layer.

(Structure 7) In a multilayer wiring board comprising: an insulating board; and a wiring layer superimposed on the insulating board through an insulating film, a contact terminal portion in an uppermost wiring layer of the multilayer wiring board has a conformation capable of preventing the contact terminal portion from being peeled.

(Structure 8) In a multilayer wiring board comprising: an insulating board; and a wiring layer superimposed on the insulating board through an insulating film, the thickness of a protective film at a contact terminal portion in an uppermost wiring layer of the multilayer wiring board is in a range of 300 angstrom to 30 $\mu$m.

(Structure 9) In a multilayer wiring board comprising: an insulating board; and a wiring layer superimposed on the insulating board through an insulating film, an uppermost layer of a protective film at a contact terminal portion in an uppermost wiring layer of the multilayer wiring board is a thin film consisting of or mainly consisting of a noble metal having the thickness of not more than 0.8 $\mu$m.

(Structure 10) In a multilayer wiring board comprising: an insulating board; and a wiring board superimposed on the insulating board through an insulating film, a protective film at a contact terminal portion in an uppermost wiring layer of the multilayer wiring board is an Ni/Au thin film sequentially formed on the uppermost wiring layer.

(Structure 11) The multilayer wiring board according to any of the structures 4 to 10 is characterized in that the coefficient of thermal expansion of the insulating board is not more than 10 ppm/° C.

(Structure 12) The multilayer wiring board for a wafer block contact board according to any of the structures 1 to 11 is characterized in that the multilayer wiring board is a multilayer wiring board constituting a part of a wafer block contact board used for conducting a test of a plurality of semiconductor devices formed on a wafer in a lump.

(Structure 13) A wafer block contact board comprises: the multilayer wiring board having a wafer block contact board according to structure 12; a membrane ring with bumps bearing a contact portion which directly comes into contact with a device to be inspected; and anisotropic conductive rubber which electrically connects the multilayer wiring board to the membrane ring with bumps.

(Structure 14) In a multilayer wiring board manufacturing method comprising a step for superimposing an insulating film and a wiring layer on an insulating board, a condition under which a crack is generated in the insulating film is obtained from a sum (total film thickness) d ($\mu$m) of the thickness of the insulating film and the internal stress f (MPa) of the insulating film, and the insulating film is formed in a range of combustions of d and f with which no crack is generated.

According to the structure 1, by satisfying the relational expression (1) described in the structure 1 with the sum (total film thickness) d of the thickness of the insulating film and the internal stress f of the insulating film, no crack is generated at a portion of the insulating film which comes into contact with a corner portion of the wiring pattern or the corner portion of a rectangular contact hole (a square via) for energizing the upper and lower wiring layers. On the other hand, a crack is generated in the insulating film which does not satisfy the relational expression (1).

It is to be noted that the sum (total film thickness) of the thickness of the insulating film means, for example, that a sum of the thickness of two insulating films if two layers of the insulating film exist and that the thickness of the insulating film if one layer of the insulating film exists.

Further, the internal stress of the insulating film varies depending on a material of the insulating film. In addition, even if the same polyimide is used, the internal stress of the insulating film changes depending on a manufacturer, a product number and others. It is to be noted that 1 MPa= 1×10$^7$ dyn/cm$^2$. The internal stress of the insulating film can be obtained by measuring and calculating a change in warpage of the board before and after formation of the insulating film.

According to the structure 2, if the insulating film satisfies the above-described relational expression (1) and the sum (total film thickness) d of the thickness of the insulating film and the internal stress f of the insulating film fall within a predetermined range described in the structure 2, the advantage of the structure 1 can be more prominently demonstrated.

If the sum (total film thickness) d of the thickness of the insulating film is less than 0.1 $\mu$m, the durability or the insulation of the insulating film is deteriorated or a pin hole may be produced. Further, if it is not less than 50 $\mu$m, it may be hard to prevent a crack, film peeling and others due to the film stress from occurring in some cases, and a via connection defect may be apt to be generated.

On the other hand, if the internal stress f of the insulating film is less than 14 MPa, the durability or the insulation of the insulating film is deteriorated or a pin bole may be produced. Further, if it is not less than 7000 MPa, it may be hard to prevent a crack, film peeling and others due to the film stress from occurring in some cases.

In light of the above description, it is preferable that the sum (total film thickness) d of the thickness of the insulating film is not less than 1 $\mu$m and less than 50 $\mu$m and that the internal stress f of the insulating film is not less than 14 MPa and less than 700 MPa.

The thickness and the internal stress of each insulating film can be arbitrarily set in the above-described predetermined range. However, taking the high frequency insulation and the thickness of irregularities (coverage of irregularities) formed by the wiring pattern into consideration, it is preferable that the thickness of each insulating film is not less than 5 $\mu$m and the insulating film is formed as thick as possible within a range by which no crack is generated.

According to the structure 3, even if the coefficient of thermal expansion of the insulating board is not more than 10 ppm/° C., a crack can not be generated in the insulating film. Further, when the coefficient of thermal expansion of the insulating board is not more than 10 ppm/° C., it is possible to avoid the contact defect due to thermal expansion of the insulating board. In view of avoidance of the contact defect due to thermal expansion, it is preferable that the coefficient of thermal expansion of the insulating board is not more than 5 ppm/° C. and close to the coefficient of thermal expansion of silicon.

Incidentally, if the coefficient of thermal expansion of the insulating board exceeds 10 ppm/° C., the stress due to a difference in the coefficient of thermal expansion from the insulating film can not be a problem and a possibility of generation of a crack in the insulating film is low. In such a case, however, the advantage which can reduce the risk of generation of a crack can be obtained. More specifically, when taking only the stress between the insulating film and the insulating board into consideration, since the coefficient of thermal expansion of the insulating board which exceeds 10 ppm/° C. approximates the coefficient of thermal expansion of the insulating film, the displacement of these members is small at the time of thermal expansion/contraction, and whereby an excessive force does not take effect.

According to the structure 4, by making the corner portion of the wiring in the wiring layer into such a shape as that a crack is hardly generated in the insulating film, occurrence of a crack in the insulating film can be suppressed.

Specifically, when the corner portion of the wiring pattern 5a shown in FIG. 6 or the corner portion of the rectangular contact hole (a square via) 12 for energizing the upper and lower wiring layers shown in FIG. 7(a) have an angle of approximately 90° or a shaper angle, a crack 11 is apt to be generated in the insulating film 3. On the other hand, as shown in FIG. 6, when an angle θ of the wiring at a bent portion is not less than 120° or more preferably the bent portion of the wiring is rounded (eliminating an angle), generation of a crack in the insulating film can be suppressed. Additionally, adopting a contact hole without an angle (for example, a round via 13 such as shown in FIG. 7(b)) or a square via having a corner portion angle of not less than 120° can suppress generation of a crack in the insulating film.

Incidentally, no crack is usually generated in the insulating film even at the corner portion of 90° if the relational expression described in the structure 1 is satisfied, but the structure 4 can further reduce the risk and the like of partial occurrence of a crack due to irregularities in the film thickness.

When forming a plurality of wiring layers, it is preferable that the corner portion of the wiring in at least the uppermost wiring layer is made into such a shape as that a crack is hardly generated in the insulating film, but the corner portion of he wiring in any layer other than the uppermost layer can be also made in to such a shape which rarely generates a crack in the insulating film.

According to the structure 5, as shown in the right side of FIG. 9 for example, when the edge and/or the corner portion of the wiring in the wiring layer 2a is so formed as to be displaced from the edge and/or the corner portion of the wiring in any other wiring layer 5a superimposed through the insulating film 3 by not less than 100 μm in the flat surface direction, it is possible to avoid concentration of stress due to superimposition of the edge portion or the corner portion of the wiring in the wiring layer in the thickness direction, thereby preventing a crack from being generated in the interlayer insulating film. In the similar view point, it is preferable that the edge and/or the corner portion is shifted by not less than 300 μm in the flat surface direction.

Meanwhile, as shown in FIG. 8 and the left side of FIG. 9, when the edges and the like of the upper and lower wirings are superimposed two-dimensionally, the stress is concentrated at a portion sandwiched between the edges and the like, thereby producing a crack 11 in the interlayer insulating film 3.

Incidentally, although no crack is usually generated in the insulating film even though the edges and the like of the upper and lower wirings are superimposed two-dimensionally if the relational expression (1) described in the structure 1 is satisfied, the risk and the like of partial occurrence of a crack due to irregularities of the film thickness can be further reduced.

According to the structure 6, by forming a protective film only at the contact terminal portion in the uppermost wiring layer in the multilayer wiring board, the wiring layer can not be peeled off or a crack can not be generated in the insulating film due to excessive increase in the membrane stress as compared with the case where the protective film is provided across the wiring pattern. It is to be noted that electrical connection with an external circuit and the like can be assuredly attained if oxidation of the contact terminal portion which comes into contact with an external electrode can be prevented by the protective film.

As in the prior art, if the protective film is uniformly provided on the entire wiring pattern consisting of Cu and the like, the membrane stress excessively increases owing to the protective film so that the wiring layer may be peeled off or a crack may be generated in the insulating film. In case of the wiring pattern having no protective film provided thereon, although the wiring layer can not be peeled off or a crack can not be generated in the insulating film, oxidation of the wiring layer may occur or improvement of the electrical connectivity may be difficult.

As the contact terminal portion, there are a peripheral terminal (a ground terminal, a power supply terminal and others), a signal terminal and the like.

According to the structure 7, when the contact terminal portion in the uppermost wiring layer of the multilayer wiring board has a conformation capable of preventing the contact terminal portion from being peeled, peeling of the contact terminal portion can be effectively avoided.

Specifically, when a width W' (see FIG. 11) of the contact terminal portion is not more than 10 mm, peeling of the contact terminal portion can be effectively prevented. The contact terminal portion is peeled by the stress that an electroless plating film itself which consists of Ni/Au and the like formed at the contact terminal portion has. However, reducing the area of the contact terminal portion can decrease the stress the electroless plating film of Ni/Au and the like itself has in order to effectively avoid peeling of the contact terminal portion.

Further, as shown in FIG. 11, segmenting the contact terminal portion 14 by a hole 15 to be meshed can effectively prevent the contact terminal portion 14 from being peeled.

Moreover, as shown in FIG. 11, when the corner portion of the contact terminal portion 14 is rounded, the contact terminal portion can be effectively prevented from being peeled.

Further, thinning the protective film at the contact terminal portion can effectively prevent the contact terminal portion from being peeled, and this will be described in detail later.

As shown in the structure 8, it is preferable that the thickness of the protective film at the contact terminal portion is set in a range of 300 angstrom to 30 μm. If the thickness of the protective film is less than 300 angstrom, the protection function may not be fully demonstrated. If the thickness of the same exceeds 30 μm, the membrane stress may increase to cause a crack. In addition, when the film thickness exceeding 30 μm is adopted, the protection function can not be further improved.

As shown in the structure 9, it is preferable that the uppermost layer of the protective film at the contact terminal portion is a thin film consisting of a noble metal or mainly consisting of a noble metal having a thickness of not more than 0.5 μm.

Here, as the noble metal, there are Au, Ag, Pt, Ir, Os, Pd, Rh, Ru and others. Above all, a thin. film consisting of fine gold is preferable. That is because fine gold has the excellent ductility and flexibility and can follow expansion and contraction of the insulating film and the wiring so that a crack can not be generated in the insulating film. When the thickness of the noble metal thin film exceeds 0.5 μm, a crack may be produced in the insulating film.

As a method for forming the protective film at the contact terminal portion, there are the electroless plating, the electrolytic plating, the sputtering method, the printing method and others, and any method can be appropriately selected in accordance with a film material, a formation position and others.

In order to form the protective film only at the contact terminal portion, a protective film such as resist is used to protect any portion other than the contact terminal portion and plating is then carried out, for example. As another method for forming a protective film only at the contact terminal portion, there is a method by which the protective film is formed on the entire surface of the uppermost wiring layer (before patterning) by the electrolytic plating, the wiring layer and the protective film are continuously etched and the protective film on the wiring layer is partially removed by etching. Incidentally, although the electrolytic plating can further reduce interfusion of impurities as compared with the electroless plating, formation of the protective film with respect to the isolated wiring pattern is difficult. The Au film can be etched by using a water solution of iodine and potassium iodide.

As shown in the structure 10, it is preferable that the protective film of the contact terminal portion is an Ni/Au thin film sequentially formed on the uppermost wiring layer.

According to such a conformation, it is possible to obtain the protective film which has the excellent adhesiveness relative to the uppermost wiring layer composed of, e.g., a Cu wiring and also has the good oxidation resistance and stability.

In case of the Ni/Au plating using the electroless plating, the thickness of the protective film is preferably approximately 0.4 to 2.0 μm for Ni and approximately 0.05 to 0.8 μm for Au, and more preferably approximately 1 μm for Ni and approximately 0.1 to 0.5 μm for Au. That is because plating advances while Ni is substituted by Au and the Ni film thickness which is approximately two-fold or three-fold of the Au film thickness is hence required in case of the electroless plating. Further, the uppermost wiring layer does not peel under such a condition. On the other hand, in case of the electroless plating, when the thickness exceeds approximately 2 µm for Ni and 0.8 µm for Au, peeling of the wiring layer occurs.

It is to be noted that, the multilayer wiring board described in the above-described structures 1 to 9 also includes the conformation that the Ni thin film is formed on the entire surface of the uppermost Cu wiring layer and the Au protective film is formed only at the contact terminal portion.

According to the structure 1, a crack may not be generated in the insulating film. Further, when the coefficient of thermal expansion of the insulating board is not more than 10 ppm/° C., the contact defect due to thermal expansion of the insulating board can be avoided. In view of avoidance of the contact defect due to thermal expansion, it is preferable that the coefficient of thermal expansion of the insulating board is not more than 5 ppm/° C. and approximates the coefficient of thermal expansion of silicon.

According to the structure 12, it is possible to obtain the multilayer wiring board for a wafer block contact board having no crack in the insulating film.

According to the structure 13, there can be obtained a wafer block contact board having the multilayer wiring board for a wafer block contact board with no crack in the insulating film and having the excellent reliability and durability.

According to the structure 14, it is possible to manufacture the multilayer wiring board having no crack generated in the insulating film by a simple process without adding a complicated process.

DETAILED DESCRIPTION OF THE PREFERRED EMBODIMENTS

The present invention will now be described.

Figure 10A:
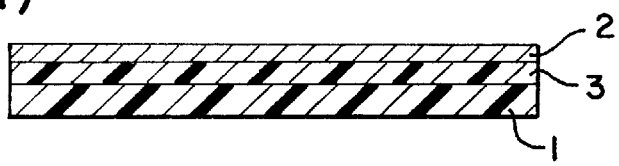
FIG. 10 is a cross-sectional view showing a conformation of the multilayer wiring board according to the present invention.

In the multilayer wiring board according to the present invention, the insulating film means an interlayer insulating film 6 sandwiched between upper and lower wiring layers such as shown in FIGS. 10(a) and (b) and an insulating film 3 and the like provided between a glass board 1 and a wiring layer 2. It is to be noted that, although a crack is hardly generated in a protective insulating film (cover coat) (not shown) for protecting an uppermost wiring layer 8, this protective insulating film is also included in the insulating film according to the present invention when a crack is generated due to a difference in coefficient of thermal expansion from the wiring layer.

Figure 1:
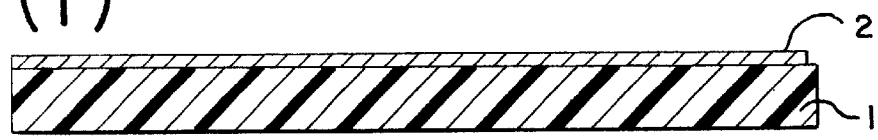
FIG. 1 is a cross-sectional view of a primary part for explaining a factoring process for a multilayer wiring board of a wafer block contact board according to an embodiment of the present invention.
Figure 1:
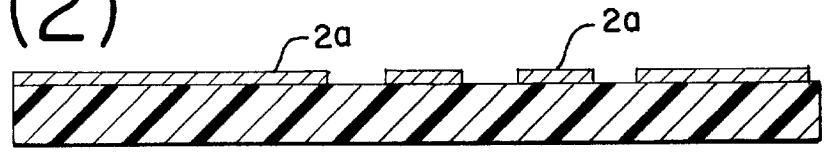
Figure 1:
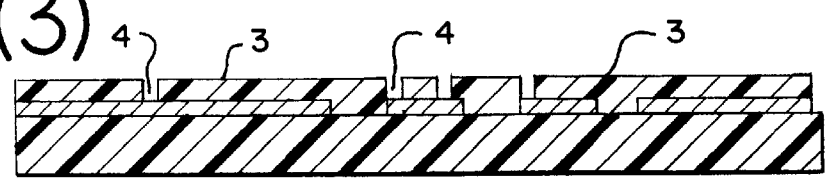
Figure 1:
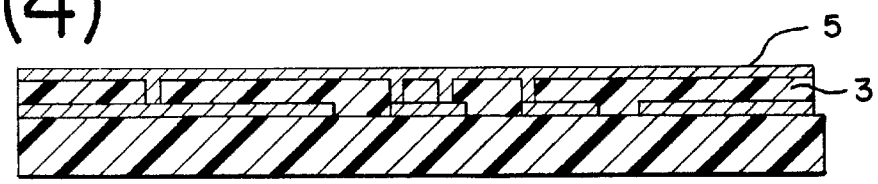
Figure 1:
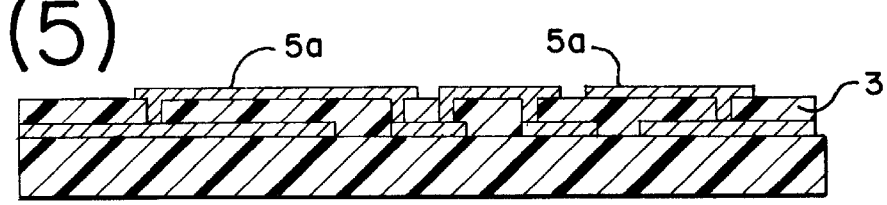
Figure 1:
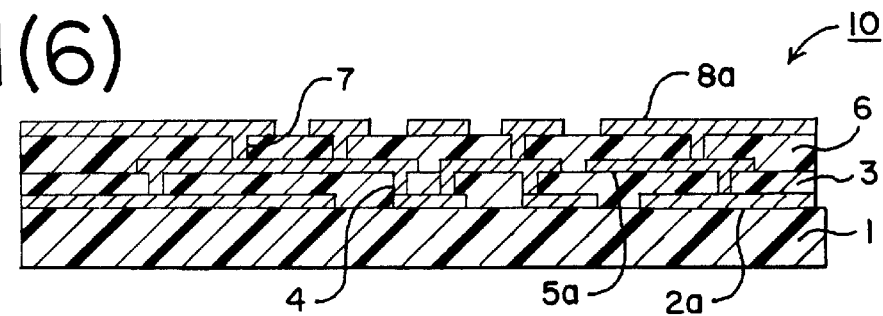

Further, "the wiring layer superimposed on the insulating board through the insulating film" according to the present invention includes the conformation shown in FIG. 1 or those shown in FIGS. 10(a) and (b).

As a material for the insulating film, a film consisting of a resin material is preferable, and there are also acrylic resin, epoxy resin, polyimide and others. Above all, polyimide which has the low coefficient of expansion and is superior in heat resistance or chemical resistance is particularly preferable.

The insulating film can be formed on the glass board or the wiring layer by, for example, the spin coating, the roll coating, the curtain coating, the spray coating, the printing method and others.

As to the wiring layer, for example, a conductive thin film is formed on the glass board or the insulating film by a thin film formation method such as a sputtering method and a wiring having a desired pattern can be formed by a photolithography method (the resist coating, exposure, development, etching and others).

Although a wiring material, a layer structure and others of the wiring in the wiring layer are not restricted to specific types, it is possible to obtain, for example, a wiring which uses Cu as a main wiring material and has a Au/Ni/Cu multilayer structure. The film thickness of Cu as the main wiring material preferably falls within a range of 0.5 to 15 µm, or more preferably 1.0 to 7.0 µm, or most preferably 2.5 to 6 µm, As an alternative material for Cu which is a main wiring material, there are Al, Mo and others.

As an alternative material for Ni, there is, for example, a metal having the high adhesiveness in connection with respective materials forming the upper and lower layers.

As an alternative material for Au, there are noble metals such as Ag, Pt, Ir, Os, Pd, Rh, Ru and others or alloyed metals mainly consisting of these noble metals.

Although gold and the like is coated on the wiring surface of the uppermost layer (outermost surface) in order to prevent and protect oxidation of the wiring surface and reduce the contact resistance, gold and the like does not have to be coated on the surface of the lower layer (internal layer). However, taking the aspect of the contact resistance into account, there occurs no problem other than increase in cost even if gold is coated on the internal wiring layer.

Gold and the like may be provided on the wiring surface later, or the multilayer wiring layer (a so-called solid) having gold and the like formed on the outermost surface is formed in advance and it is then wet-etched to form a wiring pattern. In addition, after forming a contact hole, gold and the like can be coated only at the bottom portion of the contact hole (a part of the wiring surface of the internal layer).

In the present invention, by providing a base film consisting of, e.g., Cr, W, Ti, Al, Mo, Ta, CrSi and others or a base film consisting of resin such as polyimide between the wiring of Cu and the like and the glass board, the adhesiveness relative to the glass board can be improved.

The multilayer wiring board may be obtained by forming the multilayer wiring on one side of the insulating board or forming the multilayer wirings on both sides of the insulating board.

In the present invention, as the insulating board having the coefficient of thermal expansion of not more than 10 ppm/° C., there are a glass board, a ceramics board (SiC, SiN, alumina and others), a glass ceramics board, a silicon board and others.

Above all, the glass board is preferable in the following point of view. As compared with the ceramics board, the glass board is inexpensive, easy to be processed, and has the good flatness by the high-precision grinding. Further, the glass board is transparent, it can be readily aligned and the thermal expansion can be controlled in accordance with its material. Moreover, the glass board has the excellent electrical insulating property. Additionally, warpage does not occur due to the stress and molding can be also facilitated. Also, if no-alkali glass is employed, surface elution of alkali does not have a malign influence.

As the glass board having the coefficient of thermal expansion of not more than 10 ppm/° C., there are glasses having the following composition.

There is the glass including 1 to 85 wt % of $SiO_2$, 0 to 40 wt % of $Al_2O_3$, 0 to 50 wt % of $B_2O_3$, 0 to 50 wt % of RO (where, R represents alkaline earth metal elements; Mg, Ca, Sr, Ba), 0 to 20 wt % of $R'_2O$ (where, R' represents alkaline metal elements; Li, Na, K, Rb, Cs), 0 to 5 wt % of any other component (for example, $As_2O_3$, $Sb_2O_3$, ZrO, ZnO, $P_2O_g$, $La_2O_3$, PbO, F, Cl and others). More specifically, there are glasses having the following compositions.

The glass including 55 to 65 mol % of $SiO_2$, 7 to 11 mol % of $Al_2O_3$, 1 to 11 mol % of PbO, 7 to 20 mol % of CaO, 3 to 13 mol % of MgO, 3 to 13 mol % of ZnO, 0 to 3 mol % of $ZrO_2$, 0 to 3 mol % of $F_2$, 0 to 5 mol % of $As_2O_3$, 0 to 5 mol % of $Sb_2O_3$.

The glass having a composition such that not less than 95 mol % of $SiO_2$, $Al_2O_3$, $B_2O_3$, MgO, CaO, SrO, BaO is included in total and contents of respective components are 62 to 68 mol % of $SiO_2$, 9 to 13 mol % of $Al_2O_3$, 8 to 12 mol % of $B_2O_3$, 1 to 5 mol % of MgO, 3 to 7 mol % of CaO, 1 to 3 mol % of SrO, 1 to 3 mol % of BaO, and 2 to 5 mol % of SrO+BaO.

The glass which contains 50 to 70 wt % of $SiO_2$, 14 to 28 wt % of $Al_2O_3$, 1 to 13 wt % of MgO, 1 to 5 wt % of $Na_2O$, 0 to 14 wt % of ZnO and includes a total content of the respective components equal to 80%.

The glass including 58.8 wt % of $SiO_2$, 22.3 wt % of $Al_2O_3$, 1.5 wt % of $B_2O_3$, 2.5 wt % of $Na_2O$, 4.9 wt % of MgO, 10.0 wt % of ZnO, and 0.3 wt % of any other component.

The glass including 80 wt % of $SiO_2$, 3 wt % of $Al_2O_3$, 7 wt % of $B_2O_3$, 5 wt % of $Na_2O$, 1 wt % of MgO, 4 wt % of SrO, and 1 wt % of any other component.

The glass including 25 to 65 wt % of $SiO_2$, 10 to 35 wt % of $Al_2O_3$, 12 to 35 wt % of $B_2O_3$, 0 to 10 wt % of CaO, and 0 to 30 wt % of BaO.

The glass including 58 to 63 wt % of $SiO_2$, 10 to 20 wt % of $Al_2O_3$, 2 to 10 wt % of $B_2O_3$, 3 to 10 wt % of MgO, 1 to 8 wt % of CaO, 5 to 9 wt % of ZnO, 1 to 3 wt % of $R'_2O$ (where, R' represents alkaline metal elements), 0 to 4 wt % of $ZrO_2$, and 3 wt % of each of other components ($As_2O_3$, $Sb_2O_3$, SrO, BaO, PbO and others).

Examples will now be described hereinafter.

Embodiment 1

Figure 2:
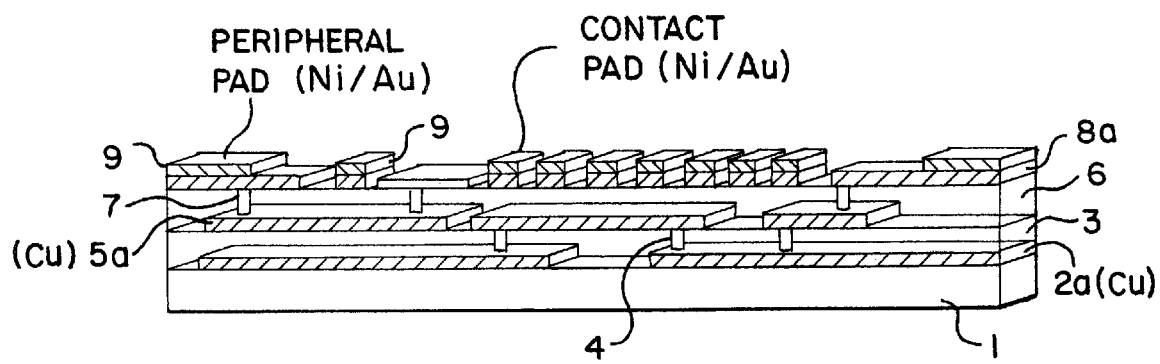
FIG. 2 is a partial perspective view showing the multilayer wiring board for a wafer block contact board according to an embodiment of the present invention.

Manufacture of Multilayer Wiring Board FIGS. 1 and 2 is cross-sectional views of a primary part showing an example of a process for manufacturing a multilayer wiring board.

As shown in a step (1) in FIG. 1, a Cr film having the thickness of approximately 300 angstrom, a Cu film having the thickness of approximately 2.5 $\mu$m, and an Ni film having the thickness of approximately 0.3 $\mu$m are sequentially formed on one side of a glass board 1 (the glass having a composition including 60.0 mol % of $SiO_2$, 9.0 mol % of $Al_2O_3$, 9.4 mol % of CaO, 9.3 mol % of MgO, 9.3 mol % of ZnO, and 3.0 mol % of PbO) whose surface is flatly ground and which has a dimension of 320 mm×320 mm and the thickness of 3 mm by the sputtering method in order to form an Ni/Cu/Cr wiring layer 2.

Here, the Cr film is provided in order to strengthen the adhesiveness relative to the glass and the Cu film. Further, the Ni film is provided for the purpose of preventing the Cu film from being oxidized, strengthening the adhesiveness relative to the resist (the adhesiveness between Cu and the resist is poor), and preventing polyimide from remaining on a bottom of a contact hole (via) by the reaction of the Cu film and polyimide.

It is to be noted that the method for forming the Ni film is not restricted to the sputtering method and the Ni film may be formed by the electrolytic plating method. Further, an Au film and the like may be formed on the Ni film by the sputtering method, the electrolytic plating method or the electroless plating method to reduce the contact resistance.

As shown in a step (2) in FIG. 1, a predetermined photolithography process (resist coating, exposure, development, etching) is then carried out and the Ni/Cu/Cr multilayer wiring layer 2 is patterned to form a wiring pattern 2a of the first layer.

Specifically, the resist (manufactured by Clariant: AZ 350) is first coated so as to obtain the thickness of 3 $\mu$m, and it is then baked at 90° C. for 30 minutes. A predetermined mask is then used to expose and develop the resist so that a desired resist pattern (not shown) is formed. With the resist pattern as a mask, the Ni/Cu/Cr multilayer wiring layer 2 is etched by using etchant of, e.g., a ferric chloride aqueous solution, and the resist is then peeled by using a resist peeling liquid. The layer is then washed and dried so that a wiring pattern 2a of the first layer is formed.

As shown in a step (3) in FIG. 1, a photosensitive polyimide antecedent is coated on the wiring pattern of the first layer so as to obtain the thickness of 10 μm by using a spinner and the like in order to form a polyimide insulating film 3. A contact hole 4 is formed to the polyimide insulating film 3.

Specifically, the applied photosensitive polyimide antecedent is baked at 80° C. for 30 minutes, and a predetermined mask is used for exposure and development to form a contact hole 4. The photosensitive polyimide antecedent is completely made into polyimide by performing curing in the nitrogenous atmosphere at 350° C. for four hours. After curing, the thickness of the polyimide insulating film 3 is reduced to a half (5 μm) of the thickness after application and, at this time, the internal stress is generated in the polyimide insulating film 3. The internal stress of the polyimide thin film after curing was 45 MPa. Thereafter, the polyimide surface is roughened by the oxygen plasma process to improve the adhesiveness relative to a wiring layer as a second layer to be formed in the next step, and organic matters, e.g., a residue such as polyimide, the developer and others in the contact hole 4 are oxidized and removed.

Subsequently, as shown in a step (4) in FIG. 1, an Ni/Cu/Cr multilayer wiring layer 5 is formed as similar to the above-described step (1).

Figure 5:
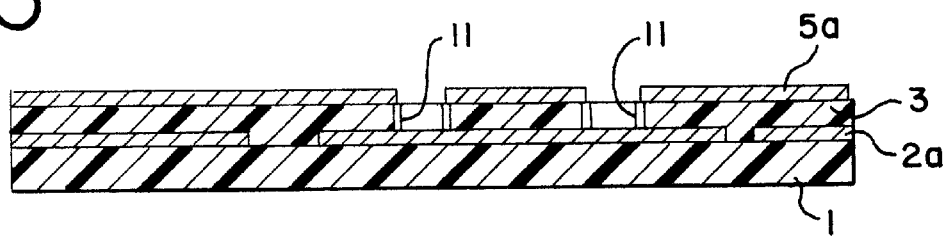
FIG. 5 is a cross-sectional view for explaining occurrence of a crack in the insulating film in the multilayer wiring board.

Then, as shown in a step (5) in FIG. 5, the Ni/Cu/Cr multilayer wiring layer 5 is patterned to form a wiring pattern 5a of the second layer as similar to the above-mentioned step (2).

As shown in a step (6) in FIG. 1, the above-described steps (3) to (5) were similarly repeated to sequentially form a polyimide insulating film 6 and a contact hole 7 for the second layer, and a wiring pattern 8a (the thickness of the Ni layer was determined as 1 μm) for the third layer in order to obtain the glass multilayer wiring board having the three-layer structure.

Then, an Au film having the thickness of 0.3 μm was formed as a protective layer only at a contact terminal portion in the wiring pattern 8a for the third layer by the electroless plating method for the purpose of preventing oxidation, improving the electrical contact property relative to an anisotropic conductive film and others.

At last, polyimide as an insulating film was applied on the board (not shown), and a protective insulating film was formed by removing polyimide at the contact terminal portion to obtain a multilayer wiring board for a wafer block contact board 10.

FIG. 2 is a partial perspective view showing the multilayer wiring board for a wafer block contact board 10. Reference numerals equal to those in FIG. 1 are given to FIG. 2. In FIG. 2, reference numeral 9 denotes an Ni/Au protective film.

In the multilayer wiring board for a wafer block contact board 10 manufactured by the above-described process, a sum (total film thickness) d of the thickness of the insulating films was 10 μm and the internal stress f of the insulating films was 45 MPa so that d×f=450 MPa·μm can be established. Further, no crack was generated in the polyimide insulating film 3 for the first layer and the polyimide insulating film 6 for the second layer. In addition, the wiring pattern 8a of the uppermost layer was not peeled.

Attachment of Anisotropic Conductive Rubber Sheet

An anisotropic conductive rubber sheet which consists of silicon resin and has metal particles embedded in a pad electrode portion was attached on the multilayer wiring board for a wafer block contact board 10 at a predetermined position.

Production of Membrane Ring

A membrane ring with bumps bearing a contact portion which directly comes into contact with a wafer was then produced.

The method for producing a membrane ring will now be described with reference to FIG. 3.

Figure 3A:
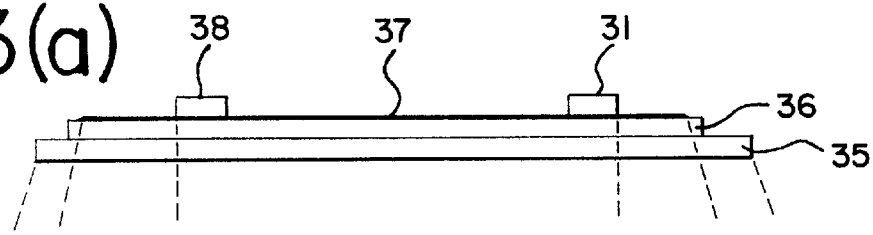
FIG. 3 is a cross-sectional view for explaining a step for forming a membrane ring in an embodiment according to the present invention.

As shown in FIG. 3(a), a silicon rubber sheet 36 having the uniform thickness of 5 mm is first placed on an aluminium plate 35 having the high flatness.

On the other hand, for example, a film 37 formed of copper having the thickness of 18 μm by the sputtering method or the plating method is prepared on the polyimide film having the thickness of 25 μm.

It is to be noted that a material, a forming method, a thickness and others of the film 37 can be arbitrarily selected. For example, a polyimide film having the thickness of approximately 25 μm (12 to 50 μm) or a silicon rubber sheet having the thickness of approximately 0.3 mm (0.1 to 0.5 mm) can be used. As to the method for forming the film, the film may be formed by the coating method, or a commercially available film or sheet can be used. Further, after casting the polyimide antecedent to a copper foil, the polyimide antecedent is heated to be dried and hardened so that a film having the structure that the polyimide film is attached on the copper foil can be obtained. Further, it is possible to adopt the structure obtained by sequentially forming a plurality of conductive metal films on one surface of the film in order to form a conductive metal layer having a lamination configuration on one surface of the film.

Moreover, although not shown, a thin Ni film may be formed between polyimide and Cu for the purpose of improving their adhesiveness and preventing film contamination.

The film 37 in which the polyimide film is attached on the copper is absorbed on the silicon rubber sheet 36 in the uniformly developed state with the copper side facing downwards. At this time, when absorption is carried out while removing an air layer by utilizing a behavior of the film 37 which is absorbed to the silicon rubber sheet 36 so as not to produce crinkling or flexure, absorption is enabled in the uniformly developed state.

A thermosetting adhesive 38 with the thickness of approximately 50 to 100 μm is thinly and uniformly applied on an adhesion surface of a circular SiC ring 31 having the diameter of approximately 8 inches and the thickness of approximately 2 mm, and the obtained product is placed on the film 37. As the thermosetting adhesive 38, one which is hardened at a temperature higher than a set temperature 80 to 150° C. in the burn-in test by 0 to 50° C. is used. In this embodiment, Bond high chip HT-100L (base resin:curing agent=4:1) (manufactured by Konish Kabushikigaisha) was used.

Further, an aluminium plate having the high flatness (weight: approximately 2.5 kg) is mounted on the ring 31 as a weight (not shown).

Figure 3B:
Figure 3C:

The product which has been subjected to the above preparation steps is heated at a temperature above the set temperature (80 to 150° C.) of the burn-in test so that the film 37 adheres to the ring 31 (FIG. 3(b)).

At this time, since the coefficient of thermal expansion of the silicon rubber sheet 36 is higher than that of the film 37, the film 37 absorbed to the silicon rubber sheet 36 thermally expands at the same level as the silicon rubber sheet 36. That is, as compared with the case where the film 37 is simply heated at a temperature above the set temperature (80 to 150° C.) of the burn-in test, the coefficient of thermal expansion of the silicon rubber sheet is higher, and this stress hence causes the polyimide film to further expands. With the large tension, the thermosetting adhesive 38 is hardened, and the film 37 adheres to the ring 31. Further, since the film 37 is absorbed on the silicon rubber sheet 36 in the uniformly developed state without crinkling or flexure, the film 37 can be absorbed to the ring 31 without producing crinkling or flexure on the film 37. Further, since the silicon rubber sheet 36 has the high flatness and the elasticity, the film 37 can uniformly adhere to the adhesion surface of the ring 31. The tensile force of the polyimide film was determined as 0.5 kg /cm$^2$.

Incidentally, when the thermosetting adhesive is not used, the film is contracted and the tensile fore is weakened. Also, the curing moment of the adhesive differs depending on positions. Therefore, the film can not uniformly adhere on the adhesion surface of the ring.

The product which has been subjected to the above thermal adhesion process is then cooled down to an ordinary temperature to be contracted to the state before heating. Thereafter, the film 37 on the external side of the ring 31 is cut and removed along the periphery of the ring 31 by using a cutter so that a membrane ring is manufactured (FIG. 3(c)).

Description will now be given as to the steps for forming a bump and a pad by processing the membrane ring.

Figure 4A:
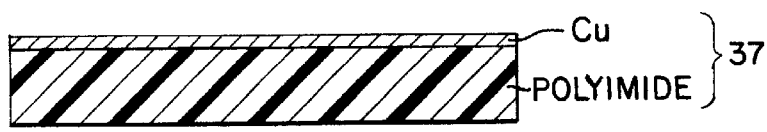
FIG. 4 is a cross-sectional view showing a primary part for explaining a step for processing a membrane ring in an embodiment according to the present invention.
Figure 4B:
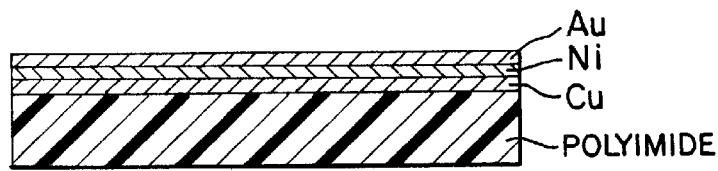

At first, as shown in FIG. 4(b), Ni having the thickness of 0.2 to 0.5 μm (the preferred range is 0.1 to 3 μm) is plated by electroplating on the copper foil (Cu) of the film 37 having the structure such that the polyimide film is attached on the copper foil in the membrane ring shown in FIG. 4(a) and manufactured as described above, and Au having the thickness of 0.1 to 0.5 μm (the preferred range is 0.5 to 2 μm) is then formed thereon to form an Au/Ni/Cu polyimide film laminated structure.

Figure 4C:
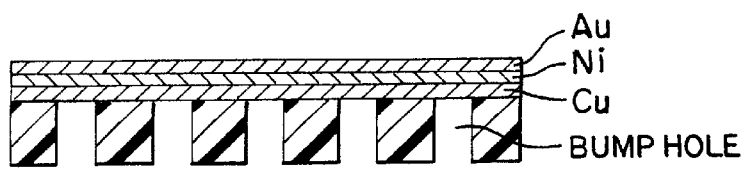

As shown in FIG. 4(c), a bump hole having a diameter of approximately 30 μm is formed at a predetermined position of the polyimide film by using the excimer laser.

Figure 4D:
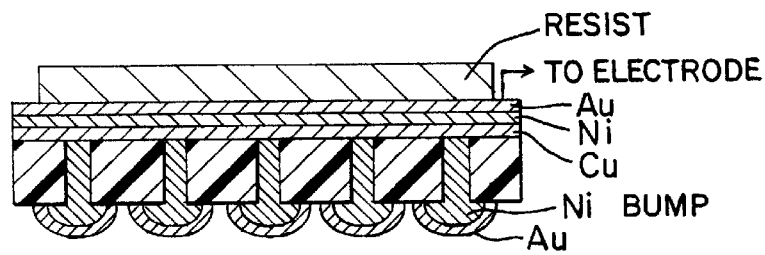
Figure 4C:
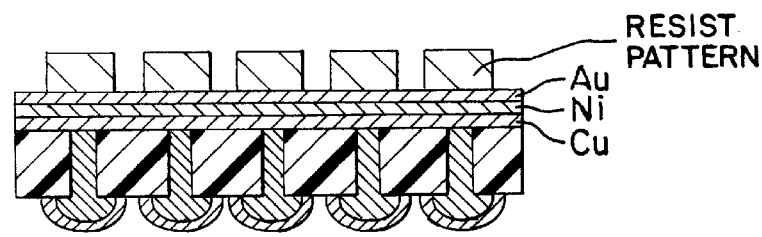

Thereafter, as shown in FIG. 4(d), a protective film such as resist having the thickness of approximately 2 to 3 μm is applied on the entire surface except a part of the Au film used as an electrode to protect the Au film in order that the surface of the uppermost Au film is not plated.

Subsequently, one of the electrodes is connected to the Au film of the uppermost layer and Ni or Ni alloy is subjected to electroplating on the polyimide film side. It is to be noted that the plating condition can be appropriately selected and a brightening agent, boric acid, nickel bromide, a PH adjuster and others can be added in the plating liquid for example. Further, adjusting a content of the brightening agent in the plating liquid can change a degree of hardness or the surface state of the bump. After the thin coating has grown so as to fill the bump hole by the electroplating, when the thin coating reaches the surface of the polyimide, it grows in the isotropic manner in the form of substantially hemisphere, thereby forming a bump consisting of the Ni alloy such as Ni or Ni—Co alloy having a degree of hardness of not less than 600 Hv.

Thereafter, the electroplated layer consisting of Au having the film thickness of 1 to 2 μm is formed on the surface of the bump. Subsequently, although not shown, the protective film is peeled.

The resist is then newly applied on the entire surface of Au of the uppermost layer, and the resist is removed except the part forming the pad by exposure or development. As shown in FIG. 4(e), the resist pattern is formed at the pad forming portion.

Figure 4F:
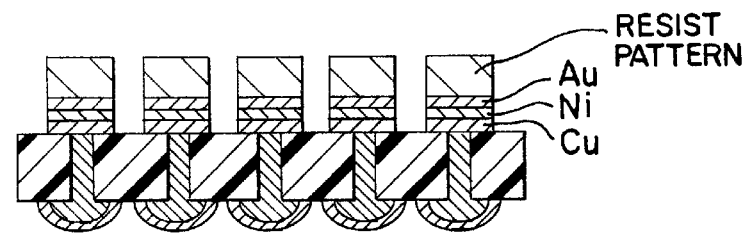
Figure 4G:
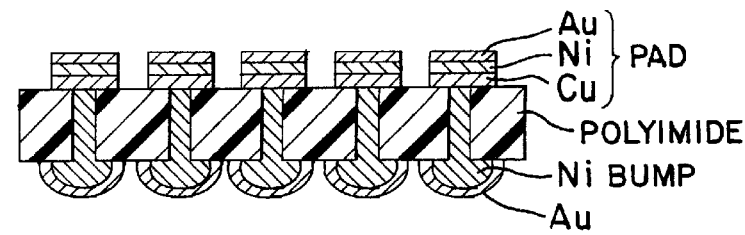

As shown in FIG. 4(f), the Au film is etched by using the iodine/potassium iodide aqueous solution, and the thin Ni film and Cu film existing between Au and Cu are etched by the ferric chloride aqueous solution and the like. After sufficiently rinsing them, the resist is peeled. As shown in FIG. 4(g), a pad consisting of Au (thickness: 1 μm)/Ni (thickness: 1.5 to 2.0 μm)/Cu is formed from the surface layer. At this time, the spray type etching is desirable because it can reduce the side etching.

After the above-described steps, the bump and the pad are formed to the membrane ring, thereby completing the membrane ring with bumps.

Assembly Process

After positioning the multilayer wiring board with an anisotropic conductive rubber sheet and the membrane ring with bumps manufactured in the above steps in order that the pad electrode does not come off, they were attached to each other to produce the wafer block contact board.

Burn-in Test

Upon positioning, the pad on the wafer and the bump of the membrane ring were fixed by a chuck and put in the burn-in device to be tested in the operating environment at the temperature of 125° C. As a result, the semiconductor devices formed on the wafer, e.g., a microcomputer, an ASIC and a memory were able to be measured respectively.

Further, when open positions were measured by a flying prober, there was no open position produced by a crack in the insulating film.

Embodiments 2 and 3

The no-alkaline glass (NA45: manufactured by HOYA Kabushikigaisha, the coefficient of thermal expansion: 4.5 ppm/° C.) was used as the insulating board, and the photosensitive polyimide antecedent having the thickness of 10 μm was applied when forming the respective insulating films for two layers. The multilayer wiring board having the three-layer structure was produced as similar to the embodiment 1 except that the thickness of the insulating film of the polyimide insulating film after curing is 5 μm and the internal stress of the polyimide thin film after curing is 18 MPa. The obtained board was used to manufacture the wafer block contact board (embodiment 2).

When forming the respective insulating films for two layers, the photosensitive polyimide antecedent having the thickness of 20 μm was applied when forming the respective insulating films for two layers. The multilayer wiring board having the three-layer structure was produced as similar to the embodiment 1 except that the thickness of the insulating film of the polyimide insulating film after curing is 10 μm and the internal stress of the polyimide thin film after curing is 18 MPa. The obtained board was used to manufacture the wafer block contact board (embodiment 3).

As a result, each sum (total film thickness) d of the thickness of the insulating films is 10 μm (embodiment 2) and 20 μm (embodiment 3), and the internal stress f of the insulating film is 18 MPa for each case (embodiments 2 and 3). d×f=180 MPa·μm (embodiment 2) and d×f=360 MPa·μm (embodiment 3) can be obtained. No crack was generated in the polyimide insulating film 3 for the first layer and the polyimide insulating film 6 for the second layer (embodiments 2 and 3).

Further, when open positions were measured by a flying prober, there was no open position due to a crack in the insulating film.

Embodiment 4

The wafer block contact board was produced as similar to the embodiment 1 except that the sum (total film thickness)

d of the thickness of the insulating films and the internal stress f of the insulating film are respectively changed. Each manufactured wafer block contact board was used to carry out the burn-in test as similar to the embodiment 1 and presence/absence of a crack in the insulating film was checked. Table 1 shows its result.

COMPARATIVE EXAMPLE 2

The multilayer wiring board having a three-layer structure was produced as similar to the embodiment 1 except that the Au (thickness: 1 μm)/Ni (thickness: 1.5 to 2.0 μm) films were sequentially formed on the entire surface of the wiring pattern 8a for the third layer by the electroless plating

TABLE 1

| Internal stress f (MPa) | Total film thickness d (μm) | 1 | 2 | 3 | 4 | 5 | 6 | 7 | 8 | 9 | 10 |
|---|---|---|---|---|---|---|---|---|---|---|---|
| 18 | d × f | 18 | 36 | 54 | 72 | 90 | 108 | 126 | 144 | 162 | 180 |
| 35 | d × f | 35 | 70 | 105 | 140 | 175 | 210 | 245 | 280 | 315 | 350 |
| 45 | d × f | 45 | 90 | 135 | 180 | 225 | 270 | 315 | 360 | 405 | 450 |
| 50 | d × f | 50 | 100 | 150 | 200 | 250 | 300 | 350 | 400 | 450 | 500 |

| Internal stress f (MPa) | Total film thickness d (μm) | 11 | 12 | 13 | 14 | 15 | 16 | 17 | 18 | 19 | 20 |
|---|---|---|---|---|---|---|---|---|---|---|---|
| 18 | d × f* | 198 | 216 | 234 | 252 | 270 | 288 | 306 | 324 | 342 | 360 |
| 35 | d × f | 385 | 420 | 455 | 490 | 525 | 560 | 595 | 630 | 665 | *700* |
| 45 | d × f | 495 | 540 | 585 | 630 | 675 | *720* | *765* | *810* | *855* | *900* |
| 50 | d × f | 550 | 600 | 650 | *700* | *750* | *800* | *850* | *900* | *950* | *1000* |

| Internal stress f (MPa) | 21 | 22 | 23 | 24 | 25 | 26 | 27 | 28 | 29 | 30 | 31 |
|---|---|---|---|---|---|---|---|---|---|---|---|
| 18 | 378 | 396 | 414 | 432 | 450 | 468 | 486 | 504 | 522 | 540 | 558 |
| 35 | *735* | *770* | *805* | *840* | *875* | *910* | *945* | *980* | *1015* | *1050* | *1085* |
| 45 | *945* | *990* | *1035* | *1080* | *1125* | *1170* | *1215* | *1260* | *1305* | *1350* | *1395* |
| 50 | *1050* | *1100* | *1150* | *1200* | *1250* | *1300* | *1350* | *1400* | *1450* | *1500* | *1550* |

| Internal stress f (MPa) | 32 | 33 | 34 | 35 | 36 | 37 | 38 | 39 |
|---|---|---|---|---|---|---|---|---|
| 18 | 576 | 594 | 612 | 630 | 648 | 666 | 684 | *702* |
| 35 | *1120* | *1155* | *1190* | *1225* | *1260* | *1295* | *1330* | *1365* |
| 45 | *1440* | *1485* | *1530* | *1575* | *1620* | *1665* | *1710* | *1755* |
| 50 | *1600* | *1650* | *1700* | *1750* | *1800* | *1850* | *1900* | *1950* |

Italic numerals represent occurrence of a crack
*unit (MPa.μ)

Italic numerals represent occurrence of a crack *: unit (MPa·μm)

It was revealed from Table 1 that a crack is generated when d×f=700 MPa·μm or above.

Figure 13:
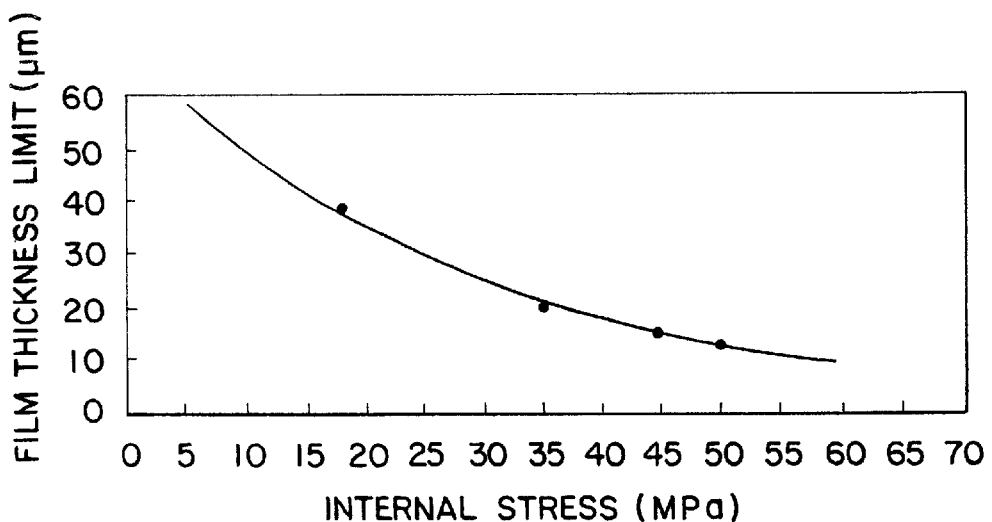
FIG. 13 is a view showing the relationship between the internal stress of the insulating film and the film thickness which is a limit for allowing no occurrence of a crack.

FIG. 13 shows the relationship between the internal stress of the insulating film and the film thickness (total film thickness) which is the boundary allowing no occurrence of a crack.

COMPARATIVE EXAMPLE 1

The photosensitive polyimide antecedent having the thickness of 20 μm was applied for forming the insulating film, and the multilayer wiring board having a three-layer structure was produced as similar to the embodiment 1 except that the thickness of the polyimide insulating film after curing is 10 μm and the internal stress of the polyimide thin film after curing is 45 MPa. The obtained board was used to manufacture the wafer block contact board.

As a result, a sum (total film thickness) d of the insulating film was 20 μm and the internal stress f of the insulating film was 45 MPa. d×f=900 MPa·μm was obtained, and a crack was produced in the polyimide insulating film 6 for the second layer.

Further, when open positions were measured by a flying prober, 100 or more open positions were confirmed.

method. The obtained board was then used to manufacture the wafer block contact board.

As a result, peeling of the wiring pattern 8a occurred, and a crack was generated in the polyimide insulating film 6 for the second layer due to this peeling.

Embodiment 5

Figure 6:
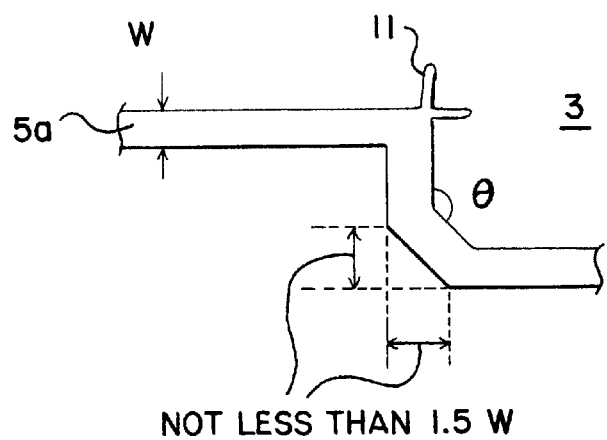
FIG. 6 is a plan view for explaining a position where a crack is generated in the insulating film and a position where a crack is generated in the same in the multilayer wiring board.
Figure 7A:
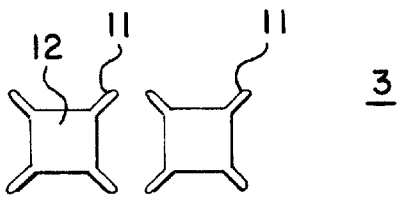
FIG. 7 is a plan view for explaining a conformation such that a crack is generated in the insulating film and a conformation such that a crack is not generated in the same in the multilayer wiring board.
Figure 7B:
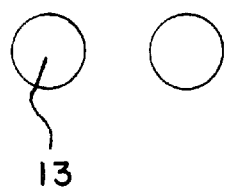
Figure 8:
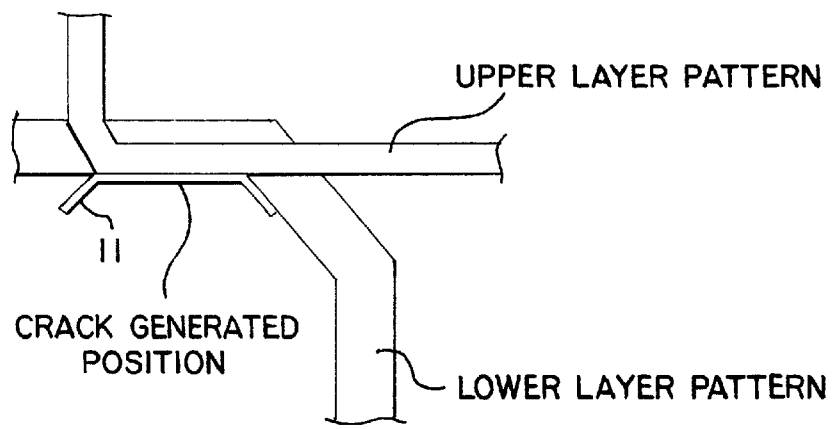
FIG. 8 is a plan view for explaining another conformation such that a crack is generated in the insulating film in the multilayer wiring board.
Figure 9:
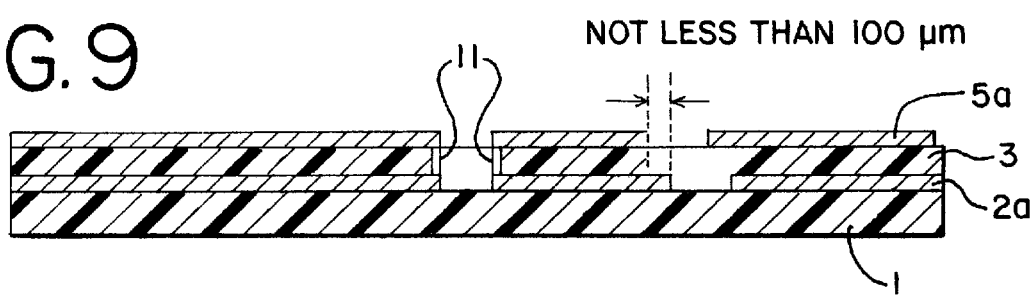
FIG. 9 is a plan view for explaining still another conformation such that a crack is generated in the insulating film and yet another conformation such that a crack is not generated in the same in the multilayer wiring board.

As shown in FIG. 6, it was confirmed that occurrence of a crack in the insulating film can be suppressed by setting an internal angle θ at a bent position of the wiring at least 120° or above or more desirably rounding the bent position of the wiring (eliminating the corner). Further, it was confirmed that occurrence of a crack in the insulating film can be suppressed by obtaining a contact hole without a corner (for example, a round via 13 such as shown in FIG. 7(b)).

Embodiment 6

Figure 10B:
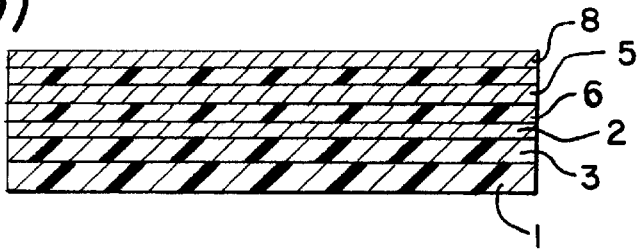

As shown in the right side in FIG. 10, it was found that occurrence of a crack in the interlayer insulating film can be suppressed by forming the edges of the upper and lower wirings so as to be shifted from each other by 100 μm or more in the plane direction in such a manner that they are not two-dimensionally superimposed each other.

Embodiment 7

Figure 11:
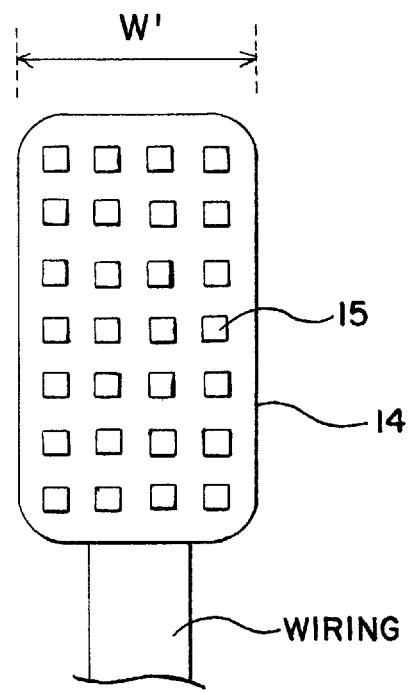
FIG. 11 is a plan view showing a conformation of a contact terminal portion in the multilayer wiring board according to the present invention.
Figure 12:
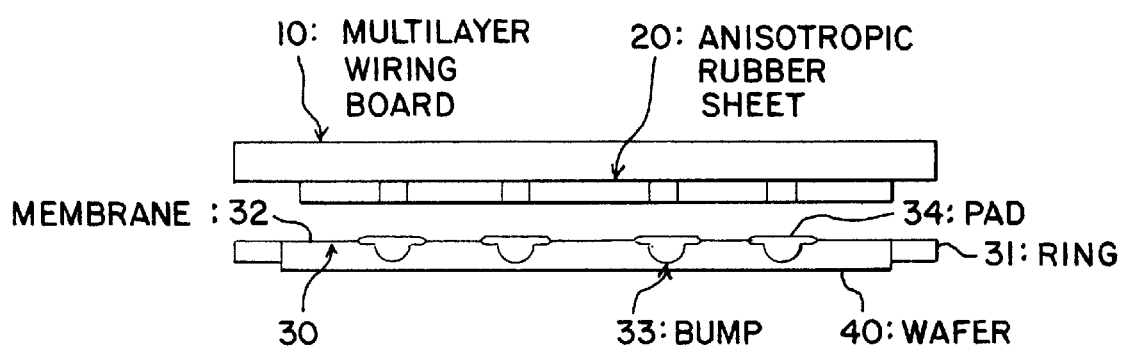
FIG. 12 is a view typically showing a wafer block contact board.

It was found that setting the width of the contact terminal portion to not more than 10 mm, segmenting the contact terminal portion 14 by the hole 15 to be meshed as shown in FIG. 11 and rounding the corner portion of the contact terminal portion 14 as shown in FIG. 11 can effectively prevent the contact terminal portion to be peeled.

Embodiment 8

After positioning the bump of the wafer block contact board (degree of hardness: not less than 600 Hz) manufactured in the respective foregoing embodiments and the pad on the wafer, contact opening/closing of the bump and the pad was repeated for a predetermined number of times with a pressure of 10 g/PIN 10 g load per one pin), and the height of the bump was measured by using a microscope. Also, deformation and abrasion of the bump were observed by a microscope.

Figure 14:
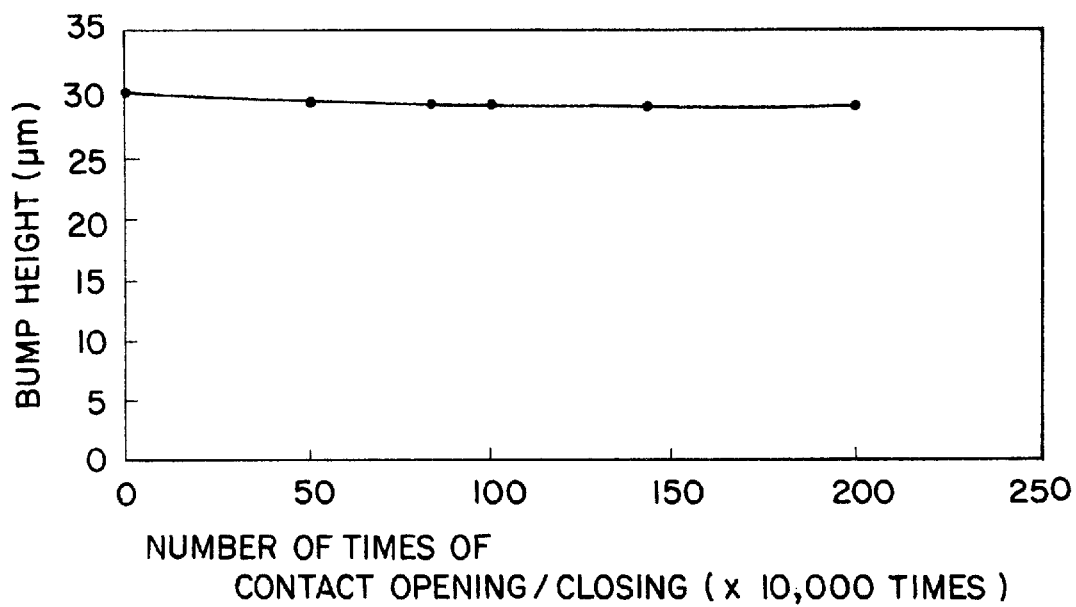
FIG. 14 is a view showing the relationship between a number of times of contact opening/closing of a bump of the wafer block contact board and a pad on the wafer and the height of the bump.

As a result, the bump was not deformed or worn away even though contact opening/closing was carried out for 2,000,000 times in either case as shown in FIG. 14 and the initial bump height (30 $\mu$m) was able to be maintained well.

It is to be noted that the present invention is not restricted to the foregoing embodiments and can be appropriately modified.

For example, a number of laminated layers of the wiring in the multilayer wiring board and the like for a wafer block contact board is not restricted to three, and a desired number of laminated layers (for example, 2 to 5 layers in general) can be used.

Further, the material of the insulating film is not restricted to polyimide and epoxy resin and others may be used.

Additionally, the wafer block contact board according to the present invention can be likewise utilized in a product inspection (electrical characteristic test) which was conventionally conducted by a probe card. Moreover, the multilayer wiring board according to the present invention uses a low expansion glass substrate or a ceramics board and is suitable for a multilayer wiring board in a multi-chip module (MCM) used for the high-density packaging.

According to the multilayer wiring board of the present invention, a crack can be prevented from being produced in the insulating film, and more particularly, a crack can be prevented from being produced in the insulating film even when alternately forming the insulating film and the wiring layer on the insulating board having the coefficient of thermal expansion of not more than 10 ppm/° C., thereby avoiding deterioration of the performance or reduction in the reliability of the multilayer wiring board.

Furthermore, according to the multilayer wiring board for a wafer block contact board of the present invention, a crack can be prevented from being generated in the insulating film and deterioration of the performance or reduction in the reliability of the multilayer wiring board can be avoided, thus obtaining the wafer block contact board having the excellent reliability and durability.

In addition, according to the method for manufacturing the multilayer wiring board of the present invention, the multilayer wiring board which does not allow occurrence of a crack in the insulating film can be manufactured by the simple process without adding a complicated process.

What is claimed is:

1. A multilayer wiring board comprising: an insulating board; and a wiring layer superimposed on said insulating board through an insulating film, wherein a sum (total film thickness) d ($\mu$m) of the thickness of said insulating film and an internal stress f (MPa) of said insulating film satisfy the following relational expression (1):

$$d \times f < 700 \text{ (MPa} \cdot \mu\text{m)} \tag{1}$$

2. The multilayer wiring board according to claim 1, wherein said sum (total film thickness) d of the thickness of said insulating film is not less than 0.1 $\mu$m and less than 50 $\mu$m, and said internal stress f of said insulating film is not less than 14 MPa and less than 7000 MPa.

3. The multilayer wiring board according to claim 1, wherein the coefficient of thermal expansion of said insulating board is not more than 10 ppm/° C.

4. A multilayer wiring board according to claim 1, wherein a corner portion of a wiring in said wiring layer has an angle of not less than 120° so that at most a crack is barely generated in said insulating film.

5. A multilayer wiring board according to claim 1, wherein an edge and/or a corner portion of a wiring in said wiring layer is formed so as to be shifted from an edge and/or a corner portion of a wiring in another wiring layer superimposed through said insulating film by not less than 100 $\mu$m in a plane direction.

6. A multilayer wiring board according to claim 1, wherein a protective film is formed only at a contact terminal portion in an uppermost wiring layer.

7. A multilayer wiring board according to claim 1, wherein the thickness of a protective film for the contact terminal portion in an uppermost wiring layer of said multilayer wiring board falls within a range of 300 angstrom to 30 $\mu$m.

8. A multilayer wiring board according to claim 1, wherein an uppermost layer of a protective film for a contact terminal portion in an uppermost wiring layer of said multilayer wiring board is a thin film which consists of a noble metal or mainly consists of a noble metal having the thickness of not more than 0.8 $\mu$m.

9. A multilayer wiring board according to claim 1, wherein a protective film for a contact terminal portion in an uppermost wiring layer of said multilayer wiring board is an Ni/Au thin film sequentially formed on said uppermost wiring layer.

10. A multilayer wiring board for a wafer block contact board according to claim 1, wherein said multilayer wiring board is a multilayer wiring board constituting a part of a wafer block contact board used for carrying out a test of a plurality of semiconductor devices formed on a wafer in a lump.

11. A multilayer wiring board according to claim 1, wherein a corner portion of a wiring in said wiring layer has a rounded shape so that at most a crack is barely generated in said insulating film.

12. A multilayer wiring board according to claim 1, wherein a contact terminal portion in an uppermost layer of said multilayer wiring board has a width of not more than 10 mm, preventing said contact terminal portion from being peeled.

13. The multilayer wiring board of claim 12, wherein said contact terminal portion is segmented by a hole to be meshed.

14. The multilayer wiring board of claim 12, wherein said contact terminal portion has a corner portion which is rounded.

15. The multilayer wiring board of claim 12, wherein said contact terminal portion is segmented by a hole to be meshed and has a corner portion which is rounded.

\* \* \* \* \*